United States Patent
Tkachev

(10) Patent No.: US 10,128,866 B2
(45) Date of Patent: Nov. 13, 2018

(54) FAST CURRENT MODE SIGMA-DELTA ANALOG-TO-DIGITAL CONVERTER

(71) Applicant: Sony Semiconductor Solutions Corporation, Kanagawa (JP)

(72) Inventor: Vadim Tkachev, Rehovot (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 192 days.

(21) Appl. No.: 14/885,047

(22) Filed: Oct. 16, 2015

(65) Prior Publication Data

US 2017/0111056 A1    Apr. 20, 2017

(51) Int. Cl.
| | |
|---|---|
| *H03M 1/00* | (2006.01) |
| *H03M 1/12* | (2006.01) |
| *H03M 3/00* | (2006.01) |
| *H04N 5/225* | (2006.01) |
| *H04N 5/378* | (2011.01) |

(52) U.S. Cl.
CPC ........... *H03M 3/486* (2013.01); *H03M 3/372* (2013.01); *H03M 3/462* (2013.01); *H03M 3/496* (2013.01); *H04N 5/2253* (2013.01); *H04N 5/378* (2013.01); *H03M 3/43* (2013.01); *H03M 3/45* (2013.01); *H03M 3/454* (2013.01); *H03M 3/456* (2013.01); *H03M 3/464* (2013.01)

(58) Field of Classification Search
CPC .. H04N 5/3745; H04N 5/378; H04N 5/37455; H04N 2201/33364; H03M 1/00–1/645
See application file for complete search history.

(56) References Cited

U.S. PATENT DOCUMENTS

| | | | | |
|---|---|---|---|---|
| 5,907,299 | A * | 5/1999 | Green | H03M 3/02 341/143 |
| 6,977,601 | B1 * | 12/2005 | Fletcher | H03M 3/32 341/143 |
| 2012/0043973 | A1 * | 2/2012 | Kremin | G06F 3/044 324/658 |

* cited by examiner

*Primary Examiner* — Sinh Tran
*Assistant Examiner* — Selam Gebriel
(74) *Attorney, Agent, or Firm* — Michael Best & Friedrich LLP

(57) ABSTRACT

A current mode sigma-delta modulator comprises an input node; a comparator that compares a voltage of the input node to a reference voltage and outputs a comparison result; an integrating capacitor connected to an input of the comparator; and a switched capacitor circuit connected at a first end to the input node, the input of the comparator, and the integrating capacitor, and connected at a second end to an output of the comparator. The current mode sigma-delta modulator is a component of an analog-to-digital converter.

19 Claims, 7 Drawing Sheets

FAST CURRENT MODE SIGMA-DELTA ANALOG-TO-DIGITAL CONVERTER

BACKGROUND

The present disclosure relates to analog-to-digital conversion. More specifically, the present disclosure relates to a system and method for using current mode sigma-delta modulators to provide efficient analog-to-digital conversion.

In digital image or video capturing systems, image sensors are used for converting light energy into electrical signals so that a digital representation may be obtained. A digital image sensor in such a system typically comprises a pixel array, a bank of sample-and-hold (SH) circuits, a bank of analog-to-digital converters (ADCs), readout circuits, timing circuits, and control circuits.

Depending on the particular application, various types of ADCs may be used in image sensors. These include flash ADCs, single-slope ADCs, successive approximation ADCs, pipelined ADCs, sigma-delta ADCs (also known as delta-sigma ADCs), and the like. Sigma-delta ADCs are often used because they can be constructed using simple circuit components, can achieve high output accuracy, and are suitable for implementation in large scale integrated circuits (such as an image sensor) where there are many ADCs operating in parallel. Using a large number of ADCs in parallel requires a circuit designer to ensure each of the ADCs have similar characteristics so that the resulting system is not subject to pattern noise as a result of, for example, circuit mismatches among the multiple ADCs.

Sigma-delta ADCs can be implemented in voltage mode or in current mode, both of which are often used in image sensors. Moreover, in image sensors, a column ADC architecture, where one ADC is provided for each column of a pixel array, is often used. In such a configuration, the pixels in each column are read out using parallel circuits on a row-by-row basis. Thus, the analog signal (whether voltage or current) representing the pixel values in each row of the sensor are fed into the ADCs in parallel to be converted into a row of corresponding digital pixel values.

In its most basic form, a sigma-delta ADC includes a modulator and a decimation filter. The ADC operates at an oversampling ratio R, which may range into the hundreds. That is, the number of binary samples in the sigma-delta modulator of the ADC is R times the number of multi-bit out samples from the decimation filter of the ADC. A comparative example of a modulator used in such a form is illustrated in FIGS. 1-2.

FIG. 1 illustrates a current mode sigma-delta modulator 100 including an input node for an input current (represented by current source 111), a clocked comparator quantizer 101, a reference current source 112, a switch 121, and an integrating capacitor 131. When used in an image sensor, current source 111 represents an output analog signal from a pixel readout circuit having a current value $I_{in}$. Reference current source 112 outputs a reference current $I_{ref}$. Comparator 101 is configured to compare a voltage $V_{int}$ on capacitor 131 with a reference voltage $V_{ref}$, and to output an output voltage $V_{out}$ as a comparison result. Switch 121 is configured such that when the output of comparator 101 is at a high level, switch 121 is closed. Conversely, when the output of comparator 101 is at a low level, switch 121 is opened.

FIG. 2 illustrates the signals $V_{out}$ and $V_{int}$ of comparator 101, along with the clock signal CLK received by comparator 101. To ensure proper operation of the ADC, the circuit is set such that $I_{in} < I_{ref}$. The initial state for illustration is one where $V_{int}$ is at a low level, such that $V_{int} < V_{ref}$. In this state, the output $V_{out}$ is low, causing switch 121 to be open. Because switch 121 is open, capacitor 131 is charged by the input current $I_{in}$, and $V_{int}$ rises as shown in FIG. 2. Eventually, $V_{int}$ becomes higher than $V_{ref}$ which causes $V_{out}$ to become high, in turn causing switch 121 to close. As illustrated in FIG. 2, $V_{out}$ does not become high at the instant $V_{in}$ crosses $V_{ref}$. This is because comparator 101 operates under the control of a clock and is only capable of switching the output in synchronization with the clock signal.

Once output $V_{out}$ does become high and switch 121 is closed, capacitor 131 is discharged by the current $I_{ref} - I_{in}$. As a result of this discharging, $V_{int}$ decreases until it becomes lower than $V_{ref}$. When this happens, output $V_{out}$ switches to the low state (after another delay due to the clocked nature of comparator 101) and the cycle repeats itself. Thus, the output of comparator 101 represents a bit stream that can be decoded to determine the value of $I_{in}$. As illustrated in FIG. 2, because of the overshoot caused by the clocked nature of comparator 101, $V_{int}$ actually ranges from $V_1$ to $V_2$ where $V_1$ is lower than $V_{ref}$ and $V_2$ is higher than $V_{ref}$.

Sigma-delta modulator 100 suffers from several drawbacks, however. For example, it is not robust against clock jitters. That is, comparator 101 operates synchronously with the clock signal to produce the output $V_{out}$ and thus to control switch 121. When clock jitter exists, the charging and discharging times will vary as a result. The amount of variation is directly proportional to the amount of clock jitter because discharging of capacitor 131 is done using reference current source 112 having a constant reference current. Because the charging and discharging times directly affect the decoded output, clock jitter will result in output errors caused by modulator 100. This becomes especially important in an image sensor where many ADCs are provided in parallel. For example, routing a clock signal from one end of the sensor to another end of the sensor incurs a delay and thus introduces clock jitter among the ADCs. Therefore, the output from each ADC will be different. This results in a pattern noise in the output of the image sensor.

Attempts to correct these deficiencies have themselves resulted in new problems. One such problematic configuration that has been proposed is illustrated in FIG. 3 as sigma-delta modulator 300. Sigma-delta modulator 300 is similar to sigma-delta modulator 100 in that it includes an input node represented by current source 311, a comparator 301, a switch 321, and an integrating capacitor 331. However, this type of modulator does not work properly because the input current on capacitor 331 can be removed once an external driver 341 is connected. In other words, the external device, rather than the feedback circuit, can define the voltage on capacitor 331.

Accordingly, there exists a need for a sigma-delta modulator having improved robustness against clock jitter in an image sensor without using a reference current source or an external driver.

SUMMARY

In one aspect, the present disclosure provides a current mode sigma-delta modulator comprising an input node; a comparator configured to compare a voltage of the input node to a reference voltage and to output a comparison result; an integrating capacitor connected to an input of the comparator; and a switched capacitor circuit connected at a first end to the input node, the input of the comparator, and the integrating capacitor, and connected at a second end to an output of the comparator.

In another aspect, the present disclosure provides a current mode sigma-delta modulator comprising an input node; an transconductance amplifier configured to input a voltage of the input node and a reference voltage to output a signal; a first integrating capacitor connected to an input of the transconductance amplifier; a comparator configured to compare an output of the transconductance amplifier to the reference voltage and to output a comparison result; a second integrating capacitor connected to an input of the comparator; a first switched capacitor circuit connected at a first end to the input node, the input of the transconductance amplifier, and the first integrating capacitor, and connected at a second end to an output of the comparator; and a second switched capacitor circuit connected at a first end to the output of the transconductance amplifier, the input of the comparator, and the second integrating capacitor, and connected at a second end to the output of the comparator.

In yet another aspect, the present disclosure provides a method operating a current mode sigma-delta modulator, comprising inputting a voltage at an input node; comparing the voltage of the input node to a reference voltage with a comparator, and outputting a comparison result; and providing an output of the comparator to an integrating capacitor that is connected to an input of the comparator and the input node, by way of a switched capacitor connected at a first end to the input node, the input of the comparator, and the integrating capacitor and at a second end to an output of the comparator.

According to various aspects, the present disclosure provides a current mode sigma-delta modulator that is robust to clock jitter, can easily be matched among a large number of analog-to-digital converters operating in parallel, and operates with efficient power consumption. In this manner, the present disclosure provides for improvements in at least the technical field of analog-to-digital conversion, as well as improvements in the related fields of imaging, image processing, and the like.

Other aspects of the present disclosure will become apparent by consideration of the detailed description and accompanying drawings.

DETAILED DESCRIPTION

Before any embodiments of the present disclosure are explained in detail, it is to be understood that the present disclosure is not limited in its application to the details of construction and the arrangement of components set forth in the following description or illustrated in the following drawings. The present disclosure is capable of other embodiments and of being practiced or of being carried out in various ways.

For example, while the following description is provided using the example of an image sensor and imaging device implementation, the present disclosure is not so limited. A current mode sigma-delta modulator according to the present disclosure may be used in any implementation where analog-to-digital conversion is performed, including but not limited to audio sensor circuits, self-controlled cars, industrial sensing systems, etc.

[Switched Capacitor Modulator]

Figure 4:
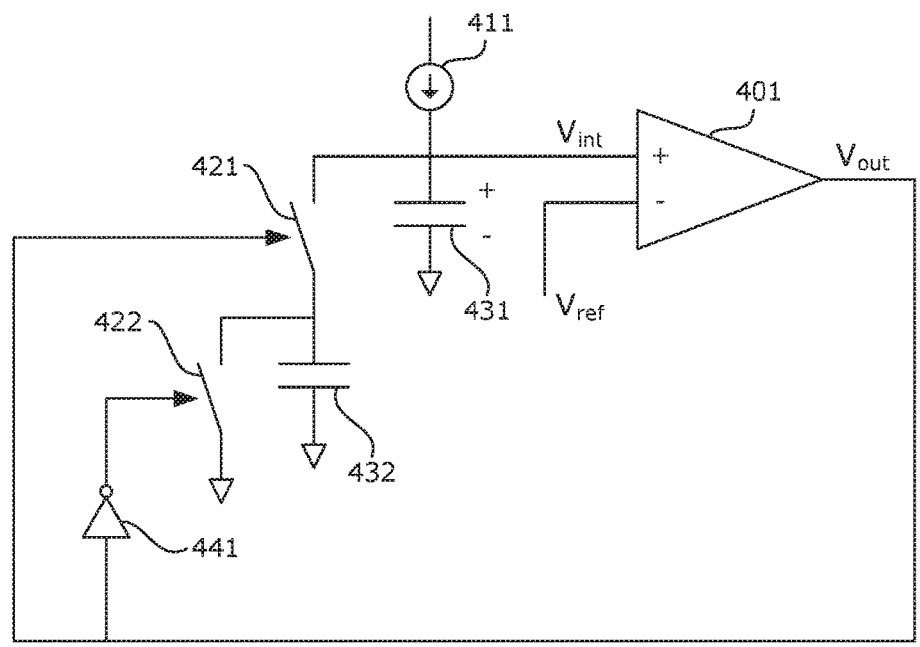
FIG. 4 illustrates a current mode sigma-delta modulator according to various aspects of the present disclosure.

FIG. 4 illustrates a current mode sigma-delta modulator 400 that does not require a reference current source or an external driver, and thus does not suffer from the limitations described above. Instead, modulator 400 includes a switched capacitor circuit. That is, modulator 400 includes an input node represented by input current source 411, a clocked comparator 401, switches 421 and 422, capacitors 431 and 432, and an inverter 441. In an image sensor application, current source 411 represents an output analog signal from a pixel readout circuit having a current value $I_{in}$. Comparator 401 is configured to compare a voltage $V_{int}$ on capacitor 431 with a reference voltage $V_{ref}$, and to output an output voltage $V_{out}$ as a comparison result.

As illustrated in FIG. 4, both switches 421 and 422 are controlled by output voltage $V_{out}$, where a control signal SW1 is applied to switch 421 and a control signal SW2 applied to switch 422 first passes through inverter 441. Because of this arrangement, the states of switches 421 and 422 are always opposite one another. Specifically, when output voltage $V_{out}$ is at a high level, switch 421 is closed and switch 422 is opened. Conversely, when output voltage Vout is at a low level, switch 421 is opened and switch 422 is closed. Preferably, switches 421 and 422 are transistors (such as MOS transistors) such that a control signal applied to a respective gate electrode thereof selectively enables charge to flow from one current terminal thereof to the other.

In this illustration, a first end of switch 421 is connected to a first electrode of capacitor 432 and a second end of switch 421 is connected to a non-inverting input of comparator 401, input node 411, and a first electrode of capacitor 431. The respective second electrodes of capacitors 431 and 432 are respectively connected to ground. Reference voltage $V_{ref}$ is provided to an inverting input of comparator 401. Additionally, a first end of switch 422 is connected to ground and a second end of switch 422 is connected to the first end of switch 421 and the first electrode of capacitor 432. Alternatively, the "grounded" end of the switches and capacitors may be connected to a predetermined voltage, such as a floating ground.

Figure 5:
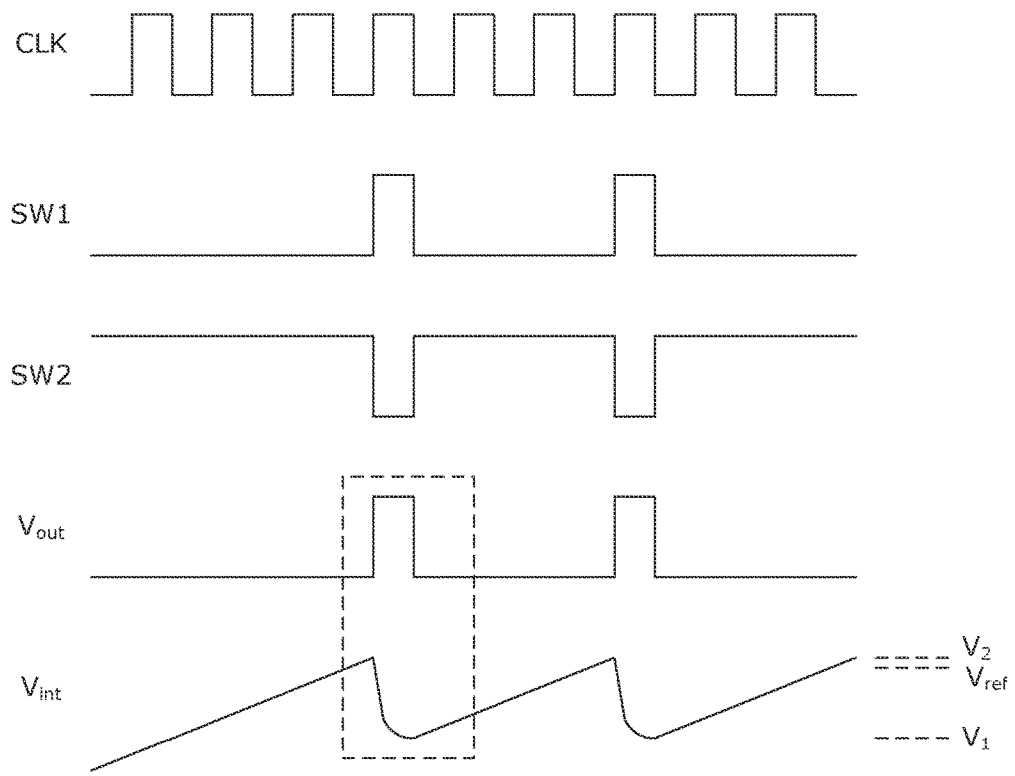
FIG. 5 illustrates various signal levels for the operation of the current mode sigma-delta modulator of FIG. 4.

Operation of modulator 400 is illustrated with in FIG. 5, which shows the voltage levels $V_{int}$ and $V_{out}$, the control signals SW1 and SW2, and a clock signal CLK. In this illustration, a high state of control signal SW1 or SW2 corresponds to a state where the corresponding switch is closed, and a low state of control signal SW1 or SW2 corresponds to a state where the corresponding switch is opened. Initially, $V_{int}$ is at a low level. In this case, the output of comparator 401 is low, and therefore switch 421 is opened and switch 422 is closed. In this state, both sides of capacitor 432 are connected to ground and thus capacitor 432 is discharged. Meanwhile, capacitor 431 is connected to input current source 411 (that is, the output of the pixel readout circuit). Thus, capacitor 431 is charged by the input current $I_{in}$ which causes the voltage $V_{int}$ to increase. Eventually, $V_{int}$ becomes higher than $V_{ref}$. When this happens, the comparator output becomes high. Since the sampling in comparator 401 is controlled by the clock, comparator 401 output may only change state in synchronization with the clock edges. Thus, $V_{out}$ does not switch from low to high until a point in time after $V_{int}$ has crossed $V_{ref}$, in which time $V_{int}$ reaches a voltage $V_2$ which is higher than $V_{ref}$.

When output $V_{out}$ does change state from a low level to a high level, the states of the switches are changed accordingly. Specifically, switch 421 is changed to a closed state and switch 422 is changed to an open state. This switch configuration connects capacitors 431 and 432 in parallel with each other. Because capacitor 432 was discharged in the previous state, a portion of the charge on capacitor 431 immediately flows to capacitor 432. This charge sharing step between the two capacitors is completed in a very short time because, in practice, the resistance in the path therebetween is very low. As a result, $V_{int}$ drops very quickly from $V_2$ to the level $V_1$ as illustrated in FIG. 5. Once the next clock edge clicks in, comparator 401 changes its output $V_{out}$ to a low level, thus causing switch 421 to be opened and switch 422 to be closed. This cycle repeats itself to produce a waveform $V_{out}$ at the output of comparator 401 such that when $V_{out}$ is low-pass filtered in a decimation filter, the output of the decimation filter produces a value which is a digital representation of analog input $I_{in}$.

Figure 1:
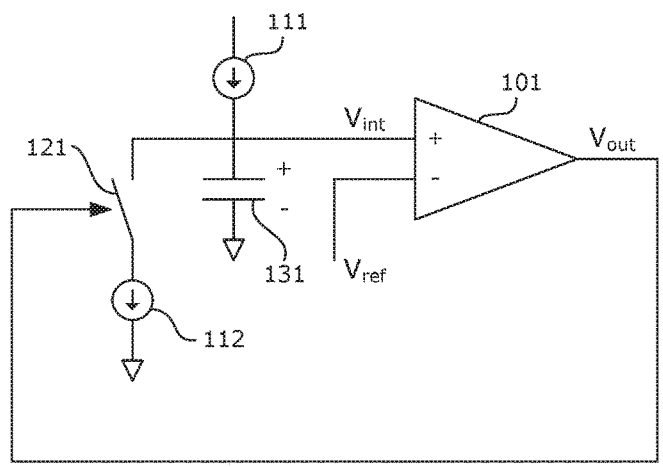
FIG. 1 illustrates a comparative example of a current mode sigma-delta modulator.
Figure 2:
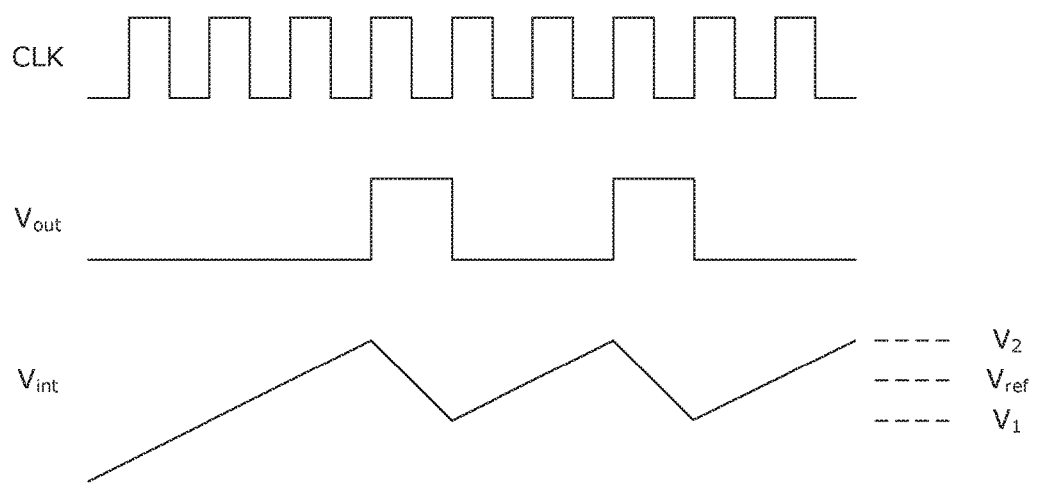
FIG. 2 illustrates various signal levels for the operation of the current mode sigma-delta modulator of FIG. 1.
Figure 3:
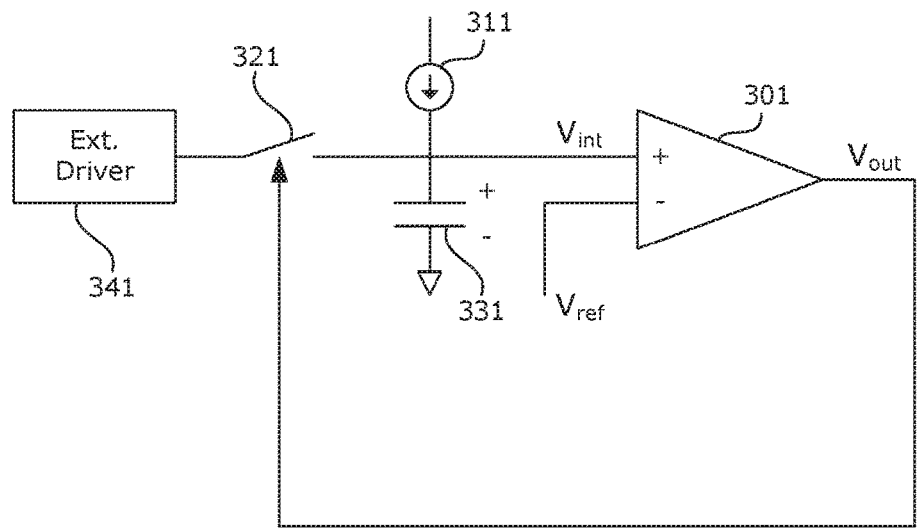
FIG. 3 illustrates another comparative example of a current mode sigma-delta modulator.
Figure 6:
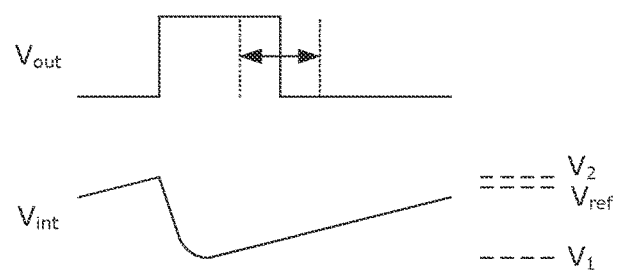
FIG. 6 illustrates an expanded view of a portion of FIG. 5.

Because modulator 400 does not use a reference current source, the circuit is more robust to clock jitter as compared with the comparative examples illustrated in FIGS. 1-3. Thus, modulator 400 is very suitable for use in applications such as an image sensor where there are many ADCs working in parallel. One reason that modulator 400 is robust to clock jitter is illustrated by the detailed waveforms in FIG. 6. FIG. 6 illustrates the portion of FIG. 5 encased in dashed lines with a magnified time axis. Thus, FIG. 6 illustrates in more detail the waveform of $V_{out}$ and $V_{int}$ during the period where $V_{out}$ is in a high state. As above, when $V_{out}$ is switched from low to high, modulator 400 is configured such that capacitors 431 and 432 are connected in parallel. The flow of charges from capacitor 431 to capacitor 432 follows an exponential curve with a very short time constant because the resistance in the path is very low.

FIG. 6 also illustrates the effect of clock jitter on the training edge of waveform $V_{out}$ (that is, the timing at which $V_{out}$ changes from high to low). This is illustrated by the dashed lines showing cases where jitter causes the training edge to occur early or late. As can be seen from FIG. 6, variation in this timing does not materially change the voltage level $V_{out}$ at the switching time because the flow of charges occurs so quickly. In other words, the transition of $V_{int}$ from $V_2$ to $V_1$ has already been completed before the training edge of the clock signal arrives, even under the influence of clock jitter. As a result, the accuracy of current mode sigma delta modulator 400 having the switched capacitor circuit is robust to time jitter. This robustness is achieved using only simple circuit components, and does not cause additional power to be dissipated.

Modulator 400 has additional useful features. One such feature is a low noise characteristic due to the use of charge sharing capacitors instead of a reference current source. Because charge sharing in capacitors is an integration process, it is robust to variations. Because a reference current source is an active component, 1/f noise can be injected from the additional transistors in the comparative example of FIG. 1. In contrast, modulator 400 uses capacitors which have only thermal noise $k_B T/C$. Therefore, the switched capacitor implementation of FIG. 4 is also more robust to the effects of noise.

Yet another feature of the switched capacitor implementation comes from the utility of matching multiple capacitors as compared to matching multiple transistors in a large-scale circuit. In an image sensor, there are typically many ADCs working in parallel; for example, one ADC per column of pixels or group of columns of pixels. In order to achieve the lowest possible pattern noise in the image sensor output, it is necessary to match all the ADCs as much as possible. In a current mode sigma-delta ADC with a switched capacitor circuit such as modulator 400, this is accomplished by matching the capacitors of each ADC because the capacitor ratio 421 to 422 directly impacts the accuracy of the output. In the comparative examples, this is accomplished by matching transistor characteristics used in the various reference current sources. Thus, the switched capacitor design of modulator 400 is useful at least because matching passive components such as capacitors may be accomplished readily, compared with matching active components such as transistors.

[Second-Order Modulator]

The above switched capacitor configuration is not restricted to first-order current mode sigma-delta modulators. The same technique can be applied to higher order current mode sigma-delta modulators, which may have better performance in the tradeoff between quantization noise and oversampling ratio. A lower oversampling ratio means that the circuit can be operated at a lower clock speed for the same data throughput rate. Therefore, it is beneficial to be able to control higher order current mode sigma-delta modulators using the same robust method.

Figure 7:
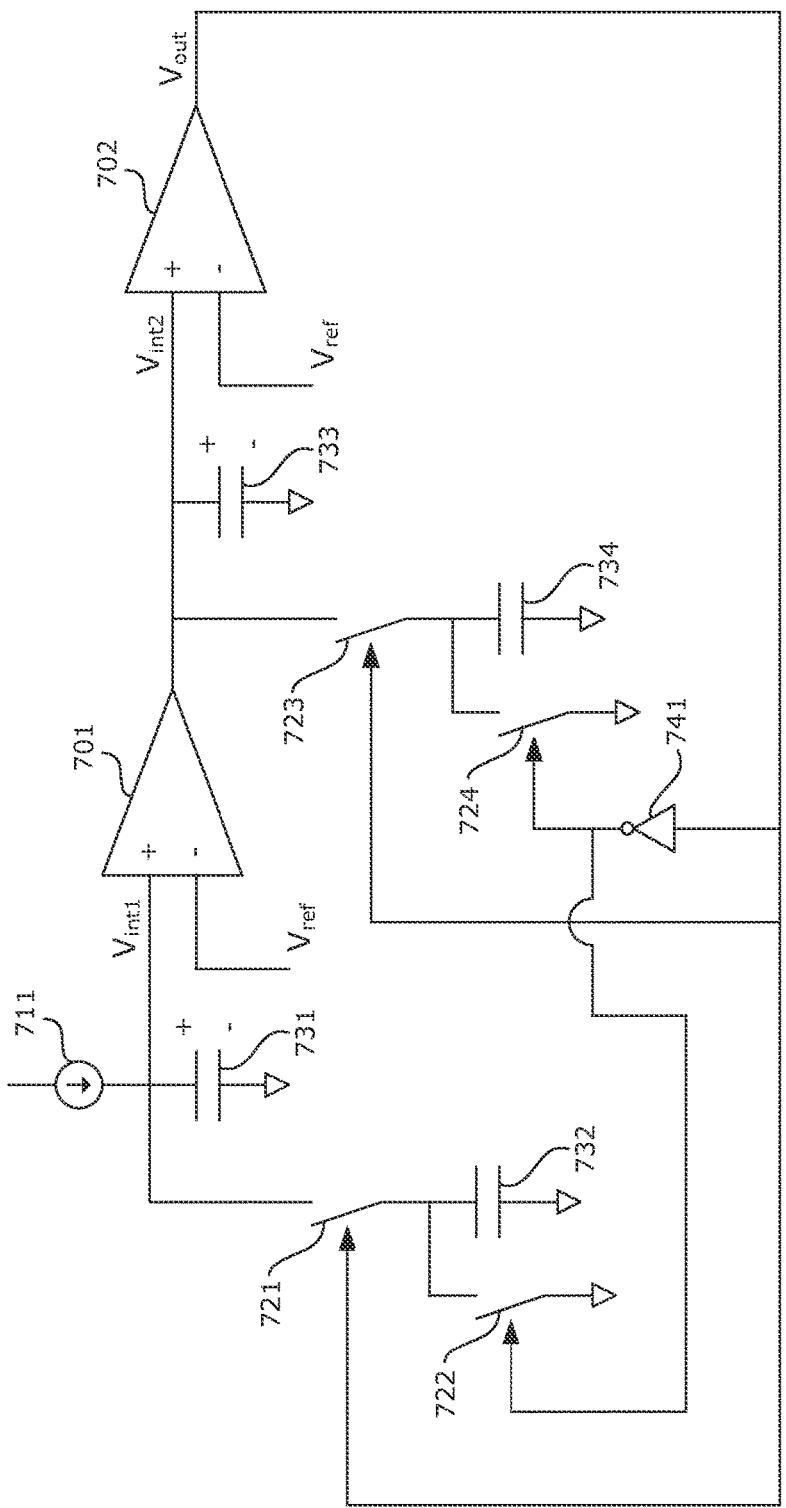
FIG. 7 illustrates a second-order current mode sigma-delta modulator according to various aspects of the present disclosure.

FIG. 7 illustrates a second-order current mode sigma-delta modulator 700 using a switched capacitor method. Modulator 700 includes an input node represented by input current source 711, differential amplifiers 701 and 702, switches 721-724, capacitors 731-734, and an inverter 741. Current source 711 represents an output analog signal from a pixel readout circuit having a current value $I_{in}$. In this illustration, amplifier 701 functions as a transconductance amplifier having transconductance $g_m$, and is configured to output an output voltage $V_{go}$ based on a voltage $V_{int1}$ on capacitor 731 and a reference voltage $V_{ref}$. Amplifier 702 functions as a comparator configured to compare a voltage $V_{int2}$ (equivalent to $V_{go}$) with the reference voltage $V_{ref}$, and to output an output voltage $V_{out}$ as a comparison result.

Two sets of switched capacitor circuits are included, in which capacitor 732 and switches 721 and 722 form the first set, whereas capacitor 734 and switches 723 and 724 form the second set. Both sets are controlled by the output voltage $V_{out}$, and all four switches are moved synchronously according to $V_{out}$. Specifically, $V_{out}$ is applied as a control signal to switches 721 and 723, and an inverted version of $V_{out}$ having passed through inverter 741 is applied as a control signal to switches 722 and 724. When output voltage $V_{out}$ is at a high level, switches 721 and 723 are closed and switches 722 and 724 are opened. Conversely, when output voltage $V_{out}$ is at a low level, switches 721 and 723 are opened and switches 722 and 724 are closed. Preferably, switches 721-724 are transistors (such as MOS transistors) such that a control signal respectively applied to a gate thereof selectively enables charge to flow from one current terminal thereof to the other.

In this illustration, a first end of switch 721 is connected to a first electrode of capacitor 732 and a second end of switch 721 is connected to a non-inverting input of amplifier 701, input node 711, and a first electrode of capacitor 731. A first end of switch 723 is connected to a first electrode of capacitor 734 and a second end of switch 723 is connected to a non-inverting input of comparator 702 and a first end of capacitor 733. The respective second electrodes of capacitors 731-734 are connected to ground. Reference voltage $V_{ref}$ is provided to respective inverting inputs of amplifier 701 and comparator 702. Moreover, a first end of switch 722 is connected to ground and a second end of switch 722 is connected to the first end of switch 721 and the first electrode of capacitor 732. Similarly, a first end of switch 724 is connected to ground and a second end of switch 724 is connected to the first end of switch 722 and the first electrode of capacitor 734. Alternatively, the "grounded" end of the switches and capacitors may be connected to a predetermined voltage, such as a floating ground.

Modulator 700 functions similar to the first-order sigma-delta modulator illustrated in FIG. 4 in the sense that $V_{out}$ controls the switches, and the switches control the charging and discharging of capacitors to produce a waveform at the output. Both circuits are similarly arranged to produce $V_{out}$ such that when $V_{out}$ is passed through a decimation filter, a digital representation of analog input $I_{in}$ is produced. The approximation (that is, the accuracy of the digital representation) from a second-order system is better than that from a first-order system, and thus modulator 700 provides additional useful features.

In modulator 700, charging and discharging of capacitors 731 and 732 causes the output voltage $V_{go}$ of amplifier 701 (having a transconductance component $g_m$) to change. When $V_{go}$ is changing, the second set of capacitors 733 and 734 are charged or discharged. As a result, the current drawn from the output of amplifier 701 is also changing (causing a current change $\Delta I_{go}$). The input-output relationship of amplifier 701 is defined by the following expression (1):

$$g_m = -\frac{\Delta I_{go}}{\Delta V_{gi}} \quad (1)$$

In expression (1), $\Delta V_{gi}$ is the change in the voltage across the two input terminals of amplifier 701, and $\Delta I_{go}$ is the change in the output current from amplifier 701.

Because $g_m$ is a property of amplifier 701, drawing current from the output of amplifier 701 causes the input voltage across the input terminals of amplifier 701 to change (that is, causes $\Delta V_{gi}$). As reference voltage $V_{ref}$ remains unchanged, the changing voltage component $\Delta V_{gi}$ causes $V_{int1}$ to change. This may result in an inaccuracy in the first stage of the second-order sigma-delta modulator 700. The overall impact of this variation or inaccuracy causes the output of modulator 700 to be inaccurate showing signal-dependent non-linearity in the output. Thus, the digital signal obtained by passing $V_{out}$ it through a decimation filter may also be inaccurate. With multiple ADCs in an image sensor, small variations of the value $g_m$ within each ADC mean that the inaccuracy in each column may be different. These differences may result in fixed pattern noise (FPN) in the output of the image sensor. Generally FPN can be corrected using a gain calibration and compensation procedure. The complexity of FPN gain compensation can depend on the linearity of the ADC.

Figure 8:
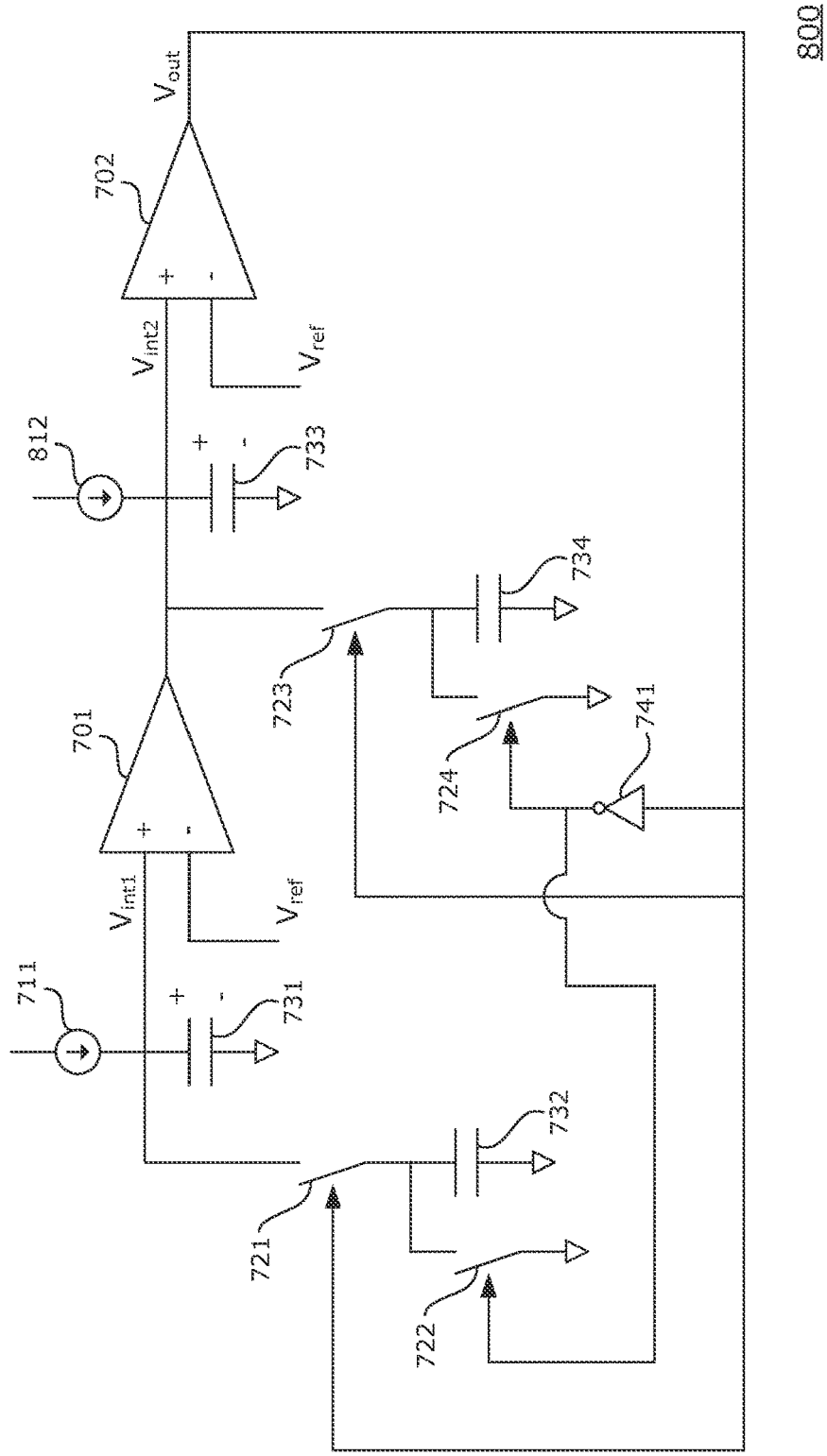
FIG. 8 illustrates another second-order current mode sigma-delta modulator according to various aspects of the present disclosure.

FIG. 8 illustrates a configuration of a second-order current mode sigma-delta modulator 800 where a replica of the input current source is added to inject current into the second integrating capacitor. The addition of the replica current source improves linearity in the system and hence the accuracy of analog-to-digital conversion. Many components of modulator 800 are the same as those of modulator 700; thus, these components are identified by the same reference numeral and a complete description of these components is provided above.

Modulator 800 differs from modulator 700 in the addition of replica current source 812. Replica current source 812 is configured to provide a current value $I_2 = K \times I_{in}$ to the first electrode of capacitor 733. With the addition of replica current source 812, the current for charging and discharging capacitors 733 and 734 can be supplied by the reference current source 812 instead of the amplifier 701. Thus, the current drawn away from the output of amplifier 701 is minimized and little to no input voltage change across the input terminals of amplifier 701 is caused (that is, $\Delta V_{gi}$ is minimized). In this way, accuracy of the second-order current mode sigma-delta modulator can be maintained.

The current value $I_2$ of replica current source 812 is matched to the current value $I_{in}$ of input current source 711 from the pixel readout, subject to a gain by a factor K. Gain factor K generally depends on the ratio of a value of capacitor 734 to capacitor 732. That is, if capacitor 732 has capacitance $C_1$ and capacitor 734 has a capacitance $C_2$, where $C_2 = K \times C_1$, replica current source 812 should be selected according to the following expression (2):

$$I_2 = K \times I_{in} = \frac{C_2}{C_1} \times I_{in} \quad (2)$$

Introducing gain factor K to the circuit brings flexibility to the design of the circuit. For example, this can lead to a circuit that uses a smaller replica current, which leads to a smaller power consumption. In an image sensor where there are many copies of the circuit in the array, the reduced power consumption for each individual circuit is significant.

In a straightforward manner, this may be extended to current mode sigma-delta modulators of third or higher order by including an additional amplifier and switched capacitor circuit for each additional order and, preferably, a replica current source for each additional order. In such cases it is necessary to put a replica current source in every stage, and each of the replica current sources is related to the values of the switch capacitors by $I_n = (C_n/C_{n-1}) \times I_{n-1}$.

[Applications]

Figure 9:
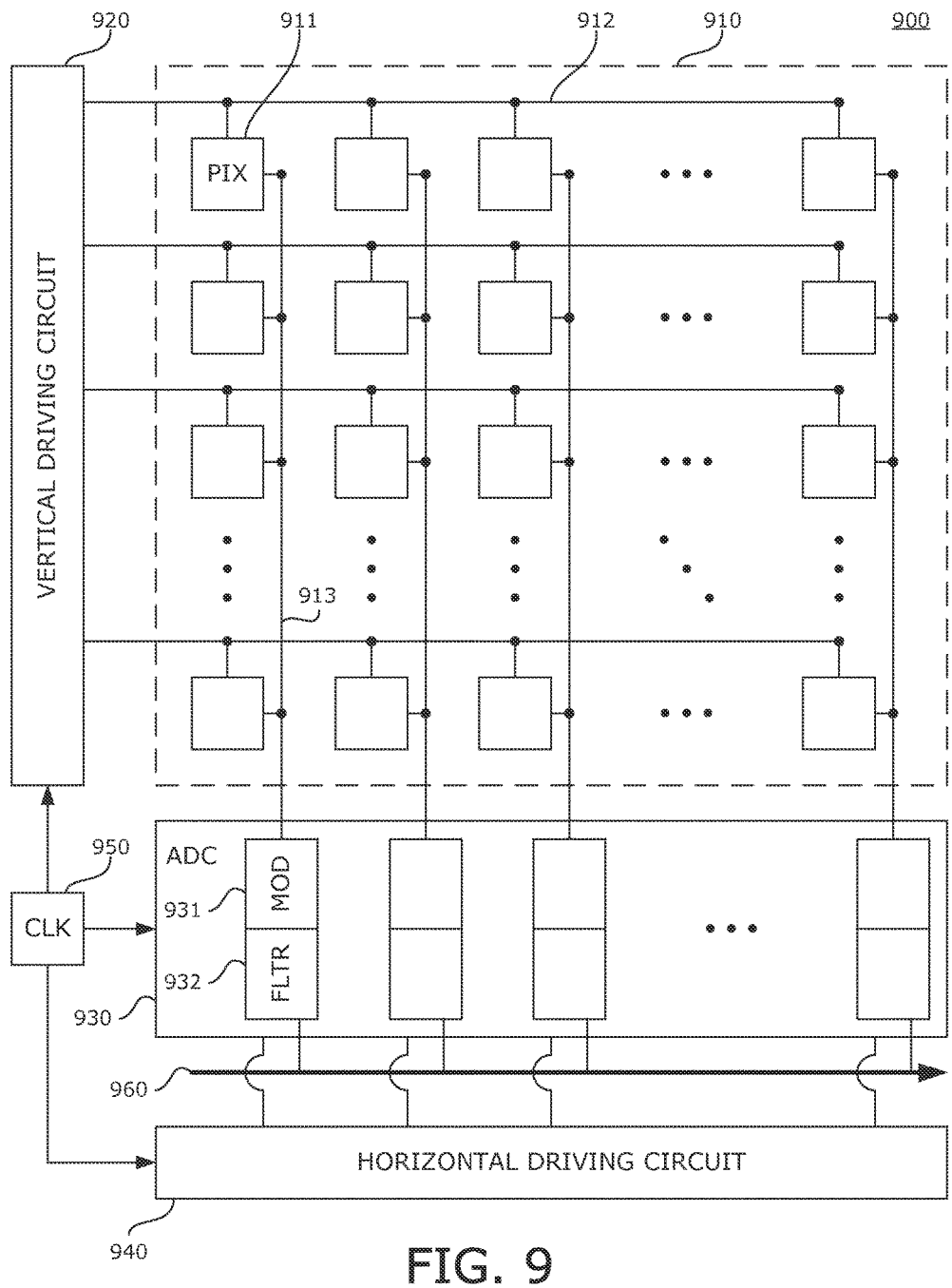
FIG. 9 illustrates an image sensor according to various aspects of the present disclosure.

As noted above, a current mode sigma-delta modulator such as modulator 400, 700, or 800 may be used in many electronics applications. FIG. 9 illustrates one such application, where a current mode sigma-delta modulator is a component of image sensor 900.

Image sensor 900 includes an array 910 of pixels 911, respective ones of which are located at intersections where horizontal signal lines 912 and vertical signal lines 913 cross one another. Horizontal signal lines 912 are operatively connected to a vertical driving circuit 920 (sometimes called a "row scanning circuit") at a point outside of the pixel array, and carry signals from vertical driving circuit 920 to respective pixels 911. Pixels 911 respectively include a photoelectric conversion device (such as a photodiode) and, preferably, a plurality of pixel transistors. A pixel 911 outputs an analog signal corresponding to an amount of incident light received to vertical signal line 913. For purposes of clarity, only a small number of pixels 911 are actually illustrated in FIG. 9. In practice, image sensor 900 may have up to tens of millions of pixels ("megapixels" or MP) or more.

Vertical signal line 913 conducts the analog signal for a particular column to a column circuit 930. While FIG. 9 illustrates one vertical signal line 913 for each column of pixel array 910, this disclosure is not so limited. For example, more than one vertical signal line 913 may be provided for each column of pixel array 910, or each vertical signal line 913 may correspond to more than one column of pixel array 910. In any case, column circuit 930 includes an ADC circuit. As illustrated, the ADC circuit includes a modulator 931 and a filter 932 for each vertical signal line 913. However each modulator/filter may correspond to more than one vertical signal line 913. Modulator 931 is, for example, a current mode sigma-delta modulator of the type illustrated above with regard to FIGS. 4-8. Filter 932 is, for example, a decimation filter as described above. Other possible components of column circuit 930, such as SH circuits, voltage-to-current (V2I) circuits, counters, and the like, are omitted from the illustration of FIG. 9 for clarity purposes.

Column circuit 930 is controlled by a horizontal driving circuit 940 (sometimes called a "column scanning circuit"). Each of vertical driving circuit 920, column circuit 930, and horizontal driving circuit 940 receive a clock signal from a controller 950. Controller 950 controls the timing and operation of various image sensor components such that analog signals from the pixel array 910, having been converted to digital signals in column circuit 930, are output via output circuit 960 for signal processing, storage, and/or transmission.

Figure 10:
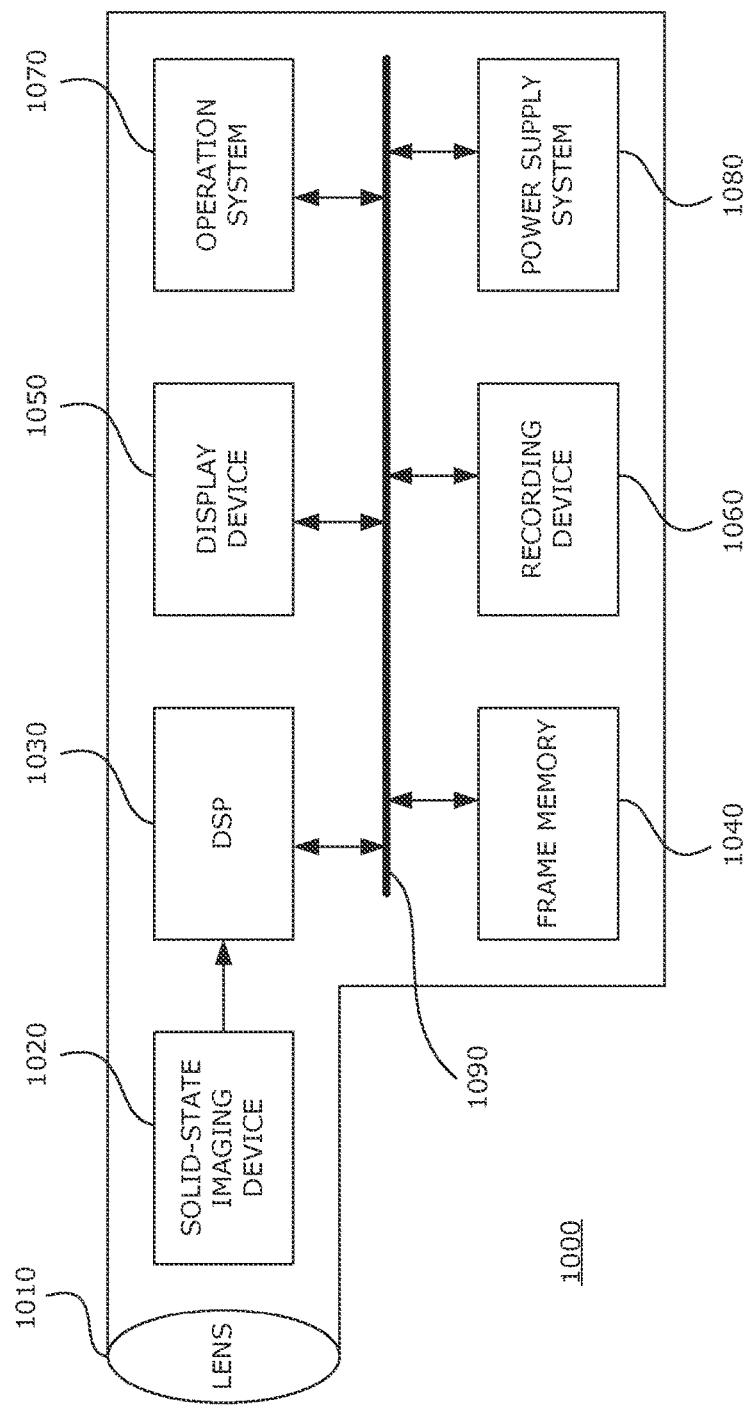
FIG. 10 illustrates an imaging device according to various aspects of the present disclosure.

FIG. 10 illustrates another such application, where a current mode sigma-delta modulator is a component of an imaging device 1000, such as a smartphone, a digital camera, and the like. As illustrated in FIG. 6, imaging device 1000 includes an optical system including a lens group 1010, a solid-state imaging device 1020 (which may be, for example, image sensor 900 including the current mode sigma-delta modulator described above), a digital signal processor (DSP) circuit 1030, a frame memory 1040, a display device 1050, a recording device 1060, an operation system 1070, and a power supply system 1080. DSP circuit 1030, frame memory 1040, display device 1050, recording device 1060, operation system 1070, and power supply system 1080 are connected to one another through a bus line 1090.

Lens group 1010 receives incident light rays from an object and forms an image on an imaging plane of solid-state imaging device 1020. Solid-state imaging device 1020 converts light quantities of the incident light beams into electric signals for individual pixels and outputs the electric signals as pixel signals. DSP 1030 performs various signal processing operations on the pixel signals output from solid-state imaging device 1020. The processed signals are written to frame memory 1040 in an order corresponding to the pixel arrangement of pixels within solid-state imaging device 1020, and may be later read out from frame memory 1040 in a similar fashion.

Display device 1050 may be a panel display device such as a liquid crystal display (LCD) device, an organic electroluminescent display (OELD or OLED) device, and the like, to display moving images or still images capture by solid-state imaging device 1020. While FIG. 10 illustrates display device 1050 as being an integral part of imaging device 1000, the present disclosure is not so limited. For example, display device 1050 may be an external display.

Recording device 1060 records the moving images or still images in a recording medium such as a hard drive, a flash drive, and the like. As above, recording device 1060 may be an external storage device, and may also be integral with an external display. Operation system 1070 issues operation instructions on various functions included in the imaging device during an operation conducted by a user. Operation system 1070 may include a user interface and/or user input systems. Power supply system 1080 supplies appropriate power to various components of imaging device 1000.

Thus, the present disclosure provides, among other things, a current mode sigma-delta modulator, an analog-to-digital converter, and an image sensor. According to the present disclosure, a sigma-delta modulator having improved robustness against clock jitter is provided, without the various disadvantages that would be caused if a reference current source or external driver were provided. Various features and advantages of the present disclosure are set forth in the following claims.

What is claimed is:

1. A current mode sigma-delta modulator, comprising:
   an input node;
   a comparator configured to compare a voltage of the input node to a reference voltage and to output a comparison result;
   an integrating capacitor connected to an input of the comparator; and
   a switched capacitor circuit connected at a first end to the input node, the input of the comparator, and the integrating capacitor, and connected at a second end to an output of the comparator,
   wherein the switched capacitor circuit includes:
      a switched capacitor having a first electrode and a second electrode, the second electrode connected to a predetermined voltage;
      a first switch directly connected to the first electrode of the switched capacitor and the input node so as to selectively allow a charge to flow therebetween; and
      a second switch connected between the predetermined voltage and the first electrode of the switched capacitor.

2. The current mode sigma-delta modulator according to claim 1, wherein the first switch is controlled by a signal corresponding to the output of the comparator.

3. The current mode sigma-delta modulator according to claim 1, wherein the second switch is controlled by a signal corresponding to an inverse of the output of the comparator.

4. The current mode sigma-delta modulator according to claim 1, wherein the first switch is a first transistor and the second switch is a second transistor.

5. The current mode sigma-delta modulator according to claim 1, wherein
   in a case where the output of the comparator is at a high level of two possible levels, the first switch is closed and the second switch is opened, and
   in a case where the output of the comparator is at a low level of the two possible levels, the first switch is opened and the second switch is closed.

6. A solid-state imaging device, comprising:
   a pixel circuit configured to convert an incident light into an analog signal;
   the current mode sigma-delta modulator according to claim 1; and
   a vertical signal line configured to conduct the analog signal to the input node of the current mode sigma-delta modulator.

7. An analog-to-digital converter, comprising:
   the current mode sigma-delta modulator according to claim 1; and a decimation filter configured to receive the output of the comparator and output a value corresponding to a digital representation of an analog signal received at the input node.

8. A method of operating a current mode sigma-delta modulator, comprising:
inputting a voltage at an input node;
comparing the voltage of the input node to a reference voltage with a comparator, and outputting a comparison result; and
providing an output of the comparator to an integrating capacitor that is connected to an input of the comparator and the input node, by way of a switched capacitor circuit connected at a first end to the input node, the input of the comparator, and the integrating capacitor and at a second end to an output of the comparator,
wherein the switched capacitor circuit includes:
a switched capacitor having a first electrode and a second electrode, the second electrode connected to a predetermined voltage;
a first switch directly connected to the first electrode of the switched capacitor and the input node so as to selectively allow a charge to flow therebetween; and
a second switch connected between the predetermined voltage and the first electrode of the switched capacitor.

9. A current mode sigma-delta modulator, comprising:
an input node;
an transconductance amplifier configured to input a voltage of the input node and a reference voltage to output a signal;
a first integrating capacitor connected to an input of the transconductance amplifier;
a comparator configured to compare an output of the transconductance amplifier to the reference voltage and to output a comparison result;
a second integrating capacitor connected to an input of the comparator;
a first switched capacitor circuit connected at a first end to the input node, the input of the transconductance amplifier, and the first integrating capacitor, and connected at a second end to an output of the comparator; and
a second switched capacitor circuit connected at a first end to the output of the transconductance amplifier, the input of the comparator, and the second integrating capacitor, and connected at a second end to the output of the comparator,
wherein the first switched capacitor circuit includes:
a first switched capacitor having a first electrode and a second electrode, the second electrode being connected to a predetermined voltage,
a first switch directly connected to the first electrode of the first switched capacitor and the input node so as to selectively allow a charge to flow therebetween, and p2 a second switch connected between the predetermined voltage and the first electrode of the first switched capacitor.

10. The current mode sigma-delta modulator according to claim 9, wherein the second switched capacitor circuit comprises:

a second switched capacitor having a first electrode and a second electrode, the second electrode being connected to the predetermined voltage,
a third switch connected between the first electrode of the second switched capacitor and an output node of the transconductance amplifier, and
a fourth switch connected between the predetermined voltage and the first electrode of the second switched capacitor.

11. The current mode sigma-delta modulator according to claim 10, wherein the first switch and the third switch are controlled by a signal corresponding to the output of the comparator.

12. The current mode sigma-delta modulator according to claim 10, wherein the second switch and the fourth switch are controlled by a signal corresponding to an inverse of the output of the comparator.

13. The current mode sigma-delta modulator according to claim 10, wherein the first switch is a first transistor, the second switch is a second transistor, the third switch is a third transistor, and the fourth switch is a fourth transistor.

14. The current mode sigma-delta modulator according to claim 10, wherein
in a case where the output of the comparator is at a high level of two possible levels, the first and third switches are closed and the second and fourth switches are opened, and
in a case where the output of the comparator is at a low level of the two possible levels, the first and third switches are opened and the second and fourth switches are closed.

15. The current mode sigma-delta modulator according to claim 10, further comprising a replica current source connected to the second integrating capacitor.

16. The current mode sigma-delta modulator according to claim 15, wherein a current value of the replica current source is equal to a current value of the input node times a ratio of a capacitance of the second switched capacitor to a capacitance of the first switched capacitor.

17. The current mode sigma-delta modulator according to claim 9, further comprising a replica current source connected to the second switched capacitor circuit.

18. A solid-state imaging device, comprising:
a pixel circuit configured to convert an incident light into an analog signal;
the current mode sigma-delta modulator according to claim 9; and
a vertical signal line configured to conduct the analog signal to the input node of the current mode sigma-delta modulator.

19. A solid-state imaging device, comprising:
a pixel circuit configured to convert an incident light into an analog signal;
the current mode sigma-delta modulator according to claim 9; and
a vertical signal line configured to conduct the analog signal to the input node of the current mode sigma-delta modulator.

* * * * *